United States Patent
Yasutake et al.

(10) Patent No.: US 9,184,217 B2
(45) Date of Patent: Nov. 10, 2015

(54) MEMORY DEVICE

(71) Applicant: Kabushiki Kaisha Toshiba, Minato-ku (JP)

(72) Inventors: Nobuaki Yasutake, Mie-ken (JP); Takayuki Okamura, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 115 days.

(21) Appl. No.: 14/022,443

(22) Filed: Sep. 10, 2013

(65) Prior Publication Data

US 2014/0312295 A1   Oct. 23, 2014

Related U.S. Application Data

(60) Provisional application No. 61/813,281, filed on Apr. 18, 2013.

(51) Int. Cl.
*H01L 47/00* (2006.01)
*H01L 27/24* (2006.01)

(52) U.S. Cl.
CPC ........ *H01L 27/2454* (2013.01); *H01L 27/2481* (2013.01)

(58) Field of Classification Search
CPC ............ H01L 45/06; H01L 2924/0002; H01L 45/1233; H01L 45/144; H01L 2924/00; H01L 45/1253; H01L 27/2409; H01L 27/2436; H01L 45/04; H01L 45/1608; H01L 27/11582; H01L 27/2463; H01L 27/2472

USPC .......... 257/2–5, 431, 432, 458, 656, E45.001; 95/675; 438/310

See application file for complete search history.

(56) References Cited

U.S. PATENT DOCUMENTS

| | | | |
|---|---|---|---|
| 7,078,763 B2 | 7/2006 | Arai et al. | |
| 8,227,784 B2 | 7/2012 | Nakajima | |
| 2008/0149913 A1 | 6/2008 | Tanaka et al. | |
| 2011/0284817 A1 | 11/2011 | Sasago et al. | |
| 2012/0147689 A1* | 6/2012 | Scheuerlein et al. | .... 365/230.03 |
| 2012/0161094 A1 | 6/2012 | Huo et al. | |
| 2013/0148400 A1* | 6/2013 | Murooka | .......... 365/63 |

OTHER PUBLICATIONS

U.S. Appl. No. 14/284,516, filed May 22, 2014, Murooka.

* cited by examiner

*Primary Examiner* — Mark A Laurenzi
(74) *Attorney, Agent, or Firm* — Oblon, McClelland, Maier & Neustadt, L.L.P.

(57) ABSTRACT

According to one embodiment, a memory device includes: a first interconnect extending in a first direction; a plurality of second interconnects extending in a second direction intersecting with the first direction, and having lower ends positioned on the first interconnect; a plurality of third interconnects extending in a third direction intersecting with the second direction; a memory layer provided between the second interconnects and the third interconnects; and selectors respectively provided between the first interconnect and the lower ends of the plurality of second interconnects.

16 Claims, 12 Drawing Sheets

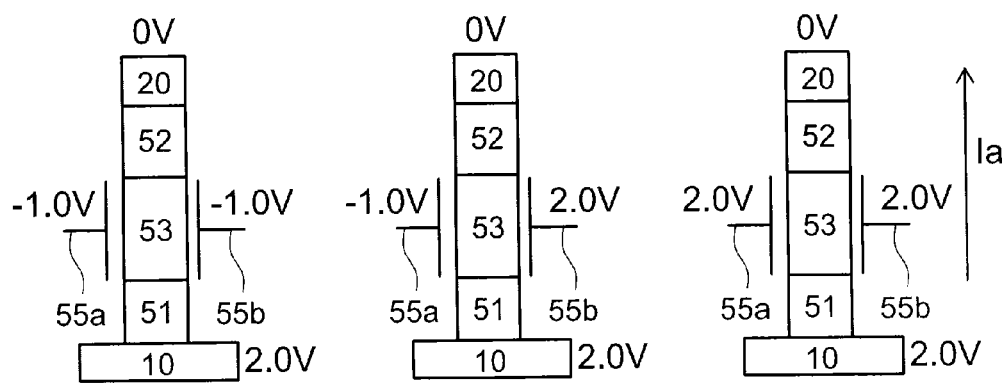
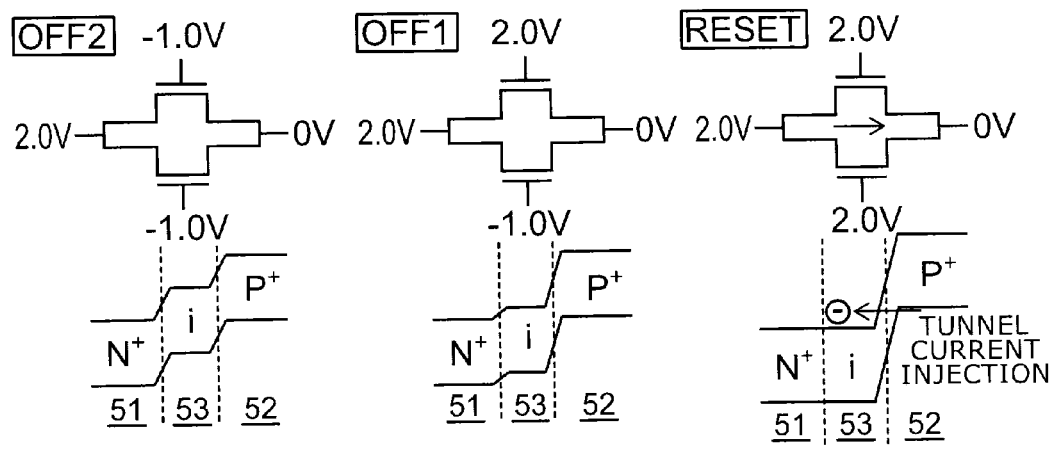
FIG. 8A    FIG. 8B    FIG. 8C

MEMORY DEVICE

CROSS-REFERENCE TO RELATED APPLICATIONS

This application is based upon and claims the benefit of priority from U.S. Provisional Patent Application 61/813,281, filed on Apr. 18, 2013; the entire contents of which are incorporated herein by reference.

FIELD

Embodiments described herein relate generally to a memory device, and the memory device is three-dimensional structure and resistance-change type semiconductor memory device.

BACKGROUND

In recent years, accompanying higher integration of a semiconductor device, a circuit pattern of an LSI element is becoming refined. The refinement of the pattern not only causes line widths from becoming narrow, but also improvements in dimensional accuracy and positional accuracy of the pattern. As for a memory device also, retaining charges are stored in a narrower region in small cells.

In recent years, as a technique to overcome such a thing, a ReRAM. (Resistance Random Access Memory) in which a memory cell is configured of a resistance-change material exists. The ReRAM can increase the integrity compared to a memory cell using a two-dimensional plane due to having a three-dimensional laminating structure. In accompanying refinement of the three-dimensional laminating structure, it is important to improve in driving power of selector devices and further reduction of off-leak current in the selector devices are required.

BRIEF DESCRIPTION OF THE DRAWINGS

FIGS. 8A to 9C are examples of schematic diagrams illustrating an operation of the memory device of the first embodiment;

DETAILED DESCRIPTION

In general, according to one embodiment, a memory device includes: a first interconnect extending in a first direction; a plurality of second interconnects extending in a second direction intersecting with the first direction, and having lower ends positioned on the first interconnect; a plurality of third interconnects extending in a third direction intersecting with the second direction; a memory layer provided between the second interconnects and the third interconnects; and selectors respectively provided between the first interconnect and the lower ends of the plurality of second interconnects, the selectors including: a first semiconductor layer of a first conductivity type; a second semiconductor layer of a second conductivity type; a third semiconductor layer provided between the first semiconductor layer and the second semiconductor layer, and the third semiconductor layer having an impurity concentration lower than an impurity concentration of the first semiconductor layer and an impurity concentration of the second semiconductor layer; and a gate electrode contacting with the third semiconductor layer via a gate insulating film, the first semiconductor layer, the second semiconductor layer, and the third semiconductor layer respectively include polysilicon or polysilicon germanium, and the first semiconductor layer, the third semiconductor layer, and the second semiconductor layer respectively are aligned in the second direction.

Hereinbelow, embodiments will be described with reference to the drawings. In the below description, identical members will be given identical reference signs, and a description of a member that had already been described will suitably be omitted.

First Embodiment

Figure 1A:
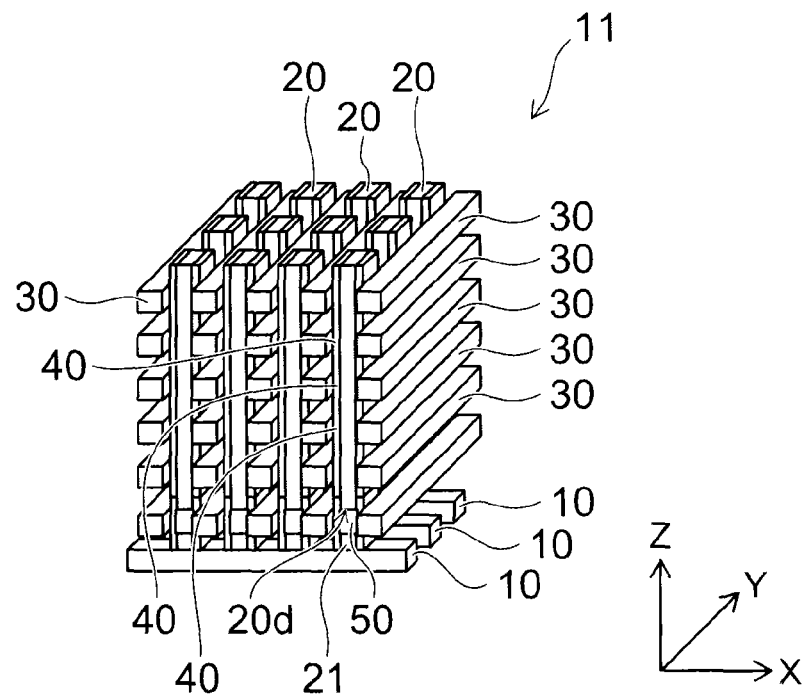
FIG. 1A is an example of a schematic stereographic diagram illustrating a memory device of a first embodiment.
Figure 1B:
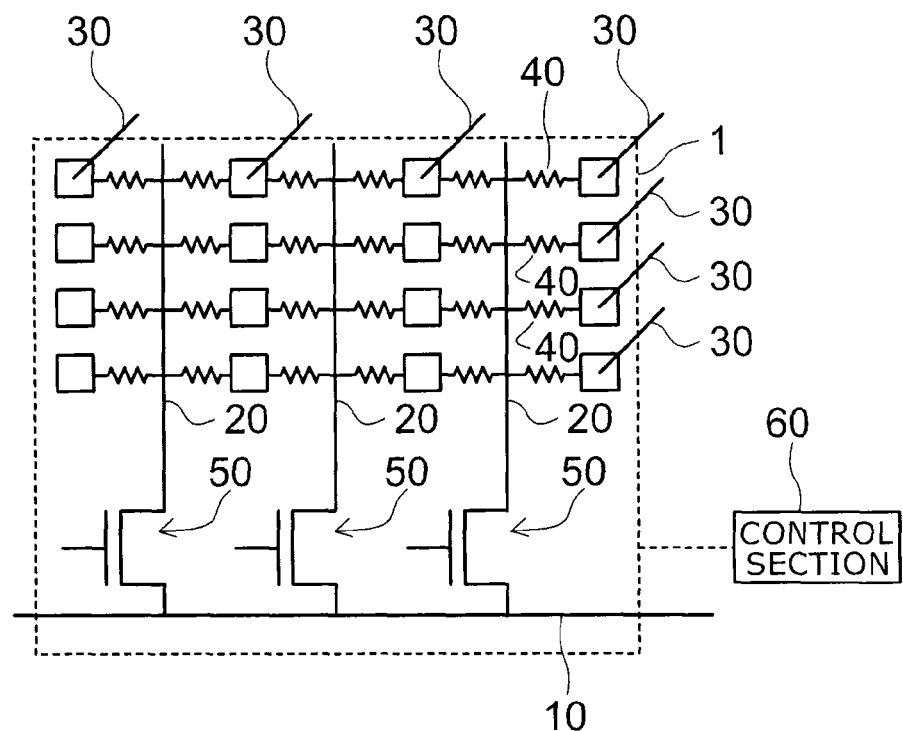
FIG. 1B is an example of an equivalent circuit diagram illustrating the memory device of the first embodiment.

FIG. 1A is an example of a schematic stereographic diagram illustrating a memory device of a first embodiment, and FIG. 1B is an example of an equivalent circuit diagram illustrating the memory device of the first embodiment.

Figure 2:
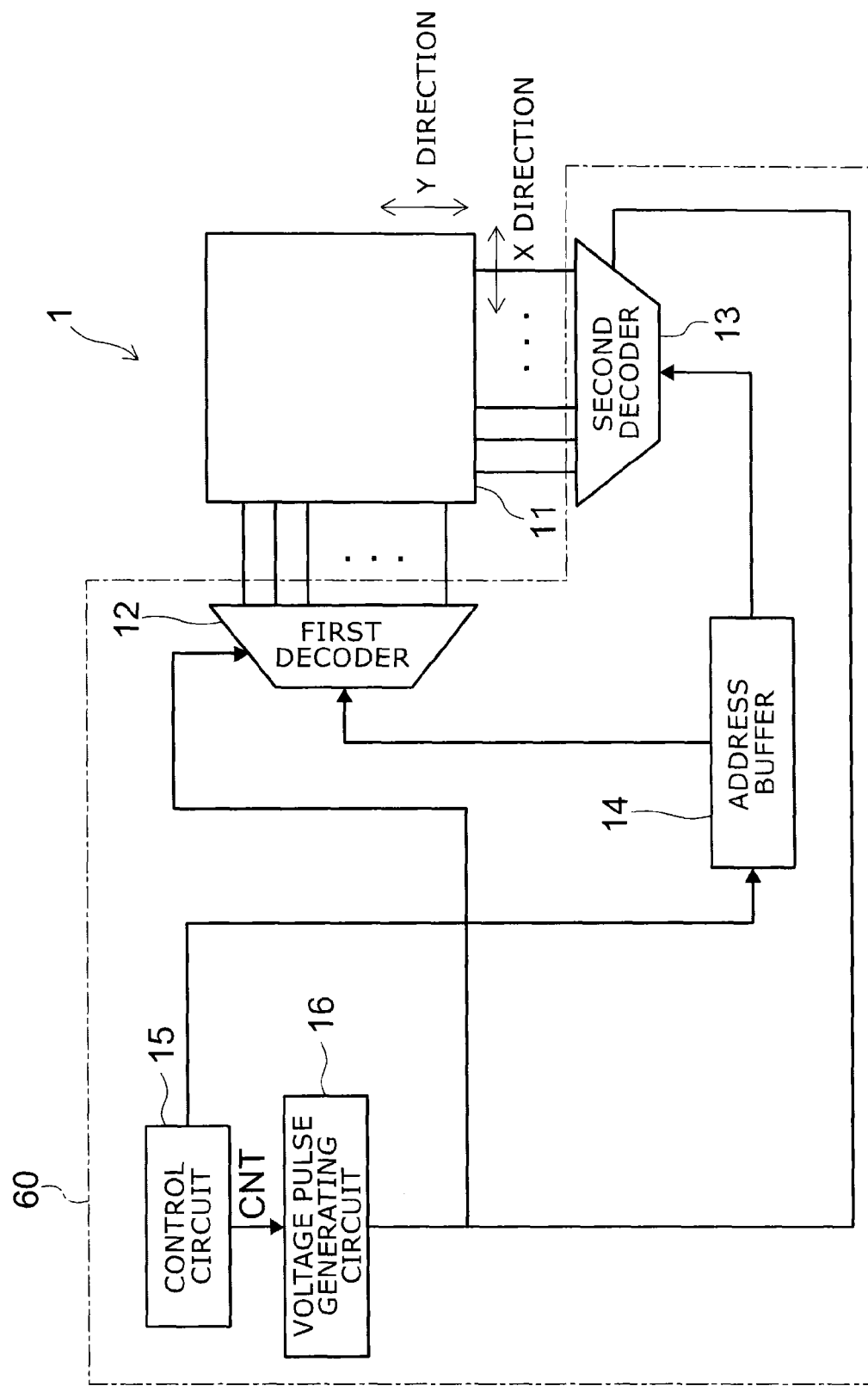
FIG. 2 is an example of a block diagram illustrating a resistance-change memory of the first embodiment.

FIG. 2 is an example of a block diagram illustrating a resistance-change memory of the first embodiment.

A resistance-change memory 1 (non-volatile memory device 1) includes a memory cell array 11 having a three-dimensional structure. A first decoder 12 is disposed on a lateral side in an X direction of the memory cell array 11. A second decoder 13 is disposed on a lateral side in a Y direction of the memory cell array 11.

The memory cell array 11 has a plurality of memory cells arranged therein. Each of the plurality of memory cells is selected by an address signal input to an address buffer 14 upon read/set (write)/reset (erase). A part of the address signal is input from the address buffer 14 to the first decoder 12, and a part of the address signal is input from the address buffer 14 to the second decoder 13.

The first decoder 12 has a function to select a word line based on the address signal. Further, the second decoder 13 has a function to select a bit line based on the address signal. Hereafter, the word line that is selected may be referred to as a "selected word line", and the local bit line that is selected may be termed a "selected bit line".

The control circuit 15 designates a magnitude (voltage value) and a width (duration time) of a pulse that the voltage pulse generating circuit 16 is to output on the set or reset and outputs to the voltage pulse generating circuit 16 as a control signal CNT.

When the control signal CNT is received, the voltage pulse generating circuit 16 generates a set voltage/reset voltage having a predetermined magnitude (voltage value) and a predetermined width (duration time).

The set voltage/reset voltage output by the voltage pulse generating circuit 16 (hereafter may be referred to as a voltage pulse) is supplied to a selected row line via the first decoder 12. Further, the voltage pulse output by the voltage pulse generating circuit 16 is supplied to a selected column line via the second decoder 13. Note that, an unselected voltage is supplied respectively to the unselected word lines and the unselected local bit lines (unselected word lines/bit lines) other than the selected word line and the selected bit line from the voltage pulse generating circuit 16 via the first decoder 12 and the second decoder 13. As a result, a resistance value of the selected memory cell changes, and resistance values of memory cells (unselected memory cells) other than the selected memory cell are not changed.

Here, an operation to rewrite the selected bit that is the selected memory cell from a low resistance state to a high resistance state may be termed a reset operation, and an operation to rewrite the same from the high resistance state to the low resistance state may be termed a set operation.

The memory cell array 11 includes global bit lines 10 (first interconnects), local bit lines 20 (second interconnects), word lines 30 (third interconnects), memory layers 40, and selectors 50. The memory device 1 includes the memory layers 40 that are arranged three-dimensionally. The memory layers 40 are resistance-change type of memory layers. Here, the memory layers 40 become the memory cells.

Each of the plurality of global bit lines 10 is, for example, extended in an X direction (first direction) and aligned in a Y direction (third direction). Each of the plurality of local bit lines 20 is, for example, extended in a Z direction (second direction) and aligned in the Y direction. Each of the plurality of word lines 30 is, for example, extended in the Y direction and aligned in the Z direction. The memory layers 40 are provided at positions where the respective ones of the plurality of local bit lines 20 and the respective ones of the plurality of word lines 30 intersect. That is, the memory device 1 is a cross-point type of memory device. Further, the selectors 50 are respectively provided between the plurality of local bit lines 20 and the plurality of global bit lines 10. One side of the selectors 50 (for example, upper side) can be directly connected to the local bit lines 20. The other side of the selectors 50 (for example, lower side) is connected to the global bit lines 10 via draw-out lines 21 (see FIG. 5). In the memory cell array 11, the draw-out lines 21 can suitably be omitted. In a case of omitting the draw-out lines 21, the other side of the selectors 50 directly makes contact with the global bit lines 10.

Here, the memory layers 40 include a material of which resistance changes according to a voltage to be applied. For example, the memory layers 40 are adapted as variable resistance layers that can reversibly transition its resistance value by the voltage to be applied, or phase-change layers that can reversibly transition between a crystallized state and an amorphous state, or the like.

As a specific material contained in the memory layers 40, a material containing at least one substance selected from the group consisting of $ZnMn_xO_y$, $ZnFe_xO_y$, $NbO_x$, Cr-doped $SrTiO_{3-x}$, $Pr_xCa_yMnO_z$, $ZrO_x$, $NiO_x$, Ti-doped $NiO_x$ film, $ZnO_x$, $TiO_x$, $TiO_xN_y$, $CuO_x$, $GdO_x$, $CuTe_x$, $HfO_x$, chalcogenide-based GST ($Ge_xSb_yTe_z$) of which resistance state changes by Joule heat generated by a voltage applied to both ends, nitride-doped GST to which doping is performed on GST, oxygen-doped GST, $Ge_xSb_y$, $In_xGe_yTe_z$ and the like is adapted.

Each of the global bit lines 10, the local bit lines 20, and the word lines 30 contains at least one of tungsten (W), aluminum (Al), copper (Cu), titanium (Ti) and the like.

The memory device 1 further includes a control circuit section 60. The control circuit section 60 is disposed in a peripheral circuit region positioned in a periphery of the memory cell array 11. Here, the control circuit section 60 includes the control circuit 15, the first decoder 12, the second decoder 13, the address buffer 14, the voltage pulse generating circuit 16, and the like. The control circuit section 60 can apply voltages to each of the global bit lines 10, the word lines 30, and gate electrodes of the selectors 50.

The control circuit section 60 can cause the voltage to be applied to both ends of the memory layers 40 to change by applying the voltage to the global bit lines 10 (or the local bit lines 20) and the word lines 30. As a result, information can be stored in and erased from the memory layers 40.

That is, in the memory layers 40, it is possible to flow a current from a local bit line 20 side toward a word line 30 side, and the current can be flown to the local bit lines 20 from the word line 30 side. The memory layers 40 can, for example, be used as bipolar type memory layers.

Figure 3:
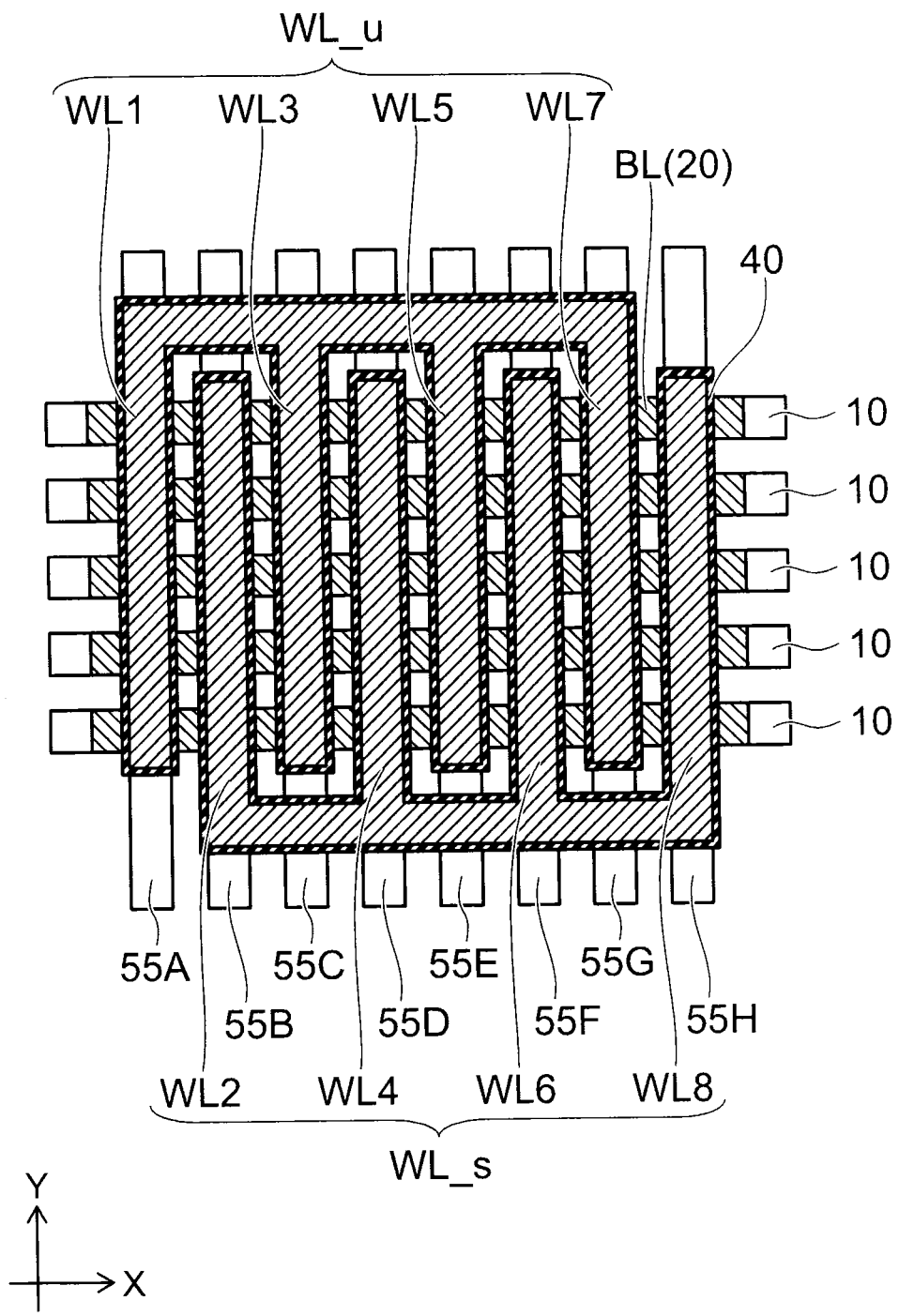
FIG. 3 illustrates a plan diagram of a memory cell array 11.

FIG. 3 illustrates a plan diagram of the memory cell array 11.

This figure is a layout of a plane formed by the X direction and the Y direction of FIG. 2, and especially is a figure for explaining a plan pattern of the word lines WL.

That is, FIG. 3 is a plan diagram of one word line 30 in the X direction and the Y direction among the plurality of word lines 30 that is laminated in the Z direction of FIG. 1A. In FIG. 3, hatched regions represent a layout of the word lines WL, and a layout of the memory layers 40.

As illustrated, every other word lines WL are commonly connected. In other words, the memory cell array includes two sets of word lines WL_u and word lines WL_u having a comb-shaped structure, and regions of the word lines WL on straight lines along the X and Y directions belong alternately to one of the comb-shaped structures.

Figure 4:
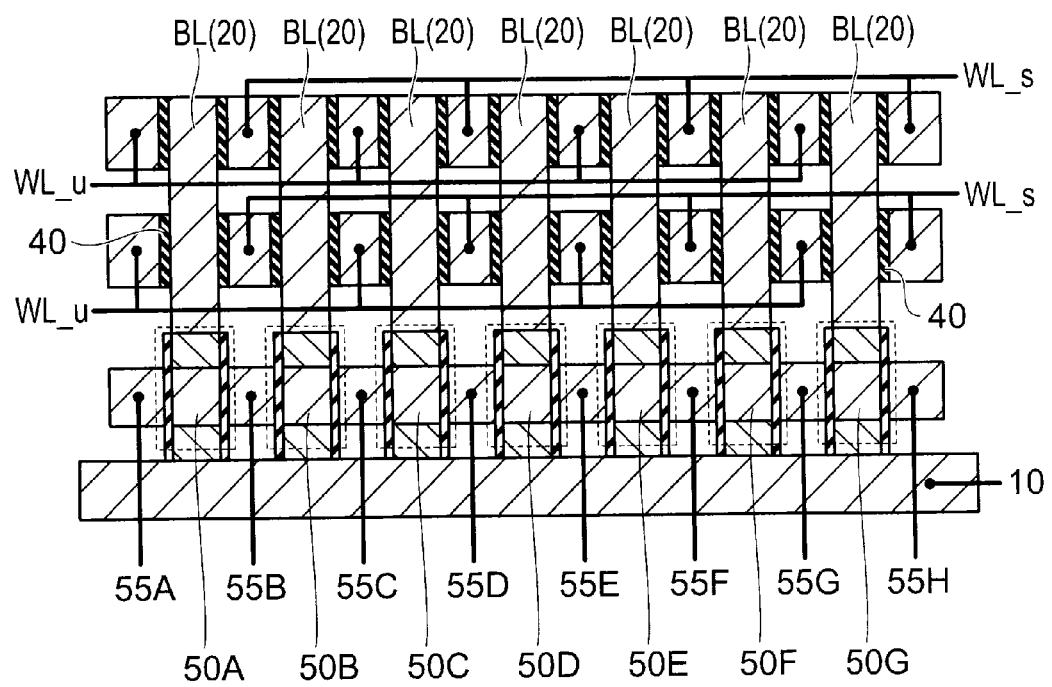
FIG. 4 is an example of a diagram illustrating a relationship of word lines and selectors.
Figure 5:
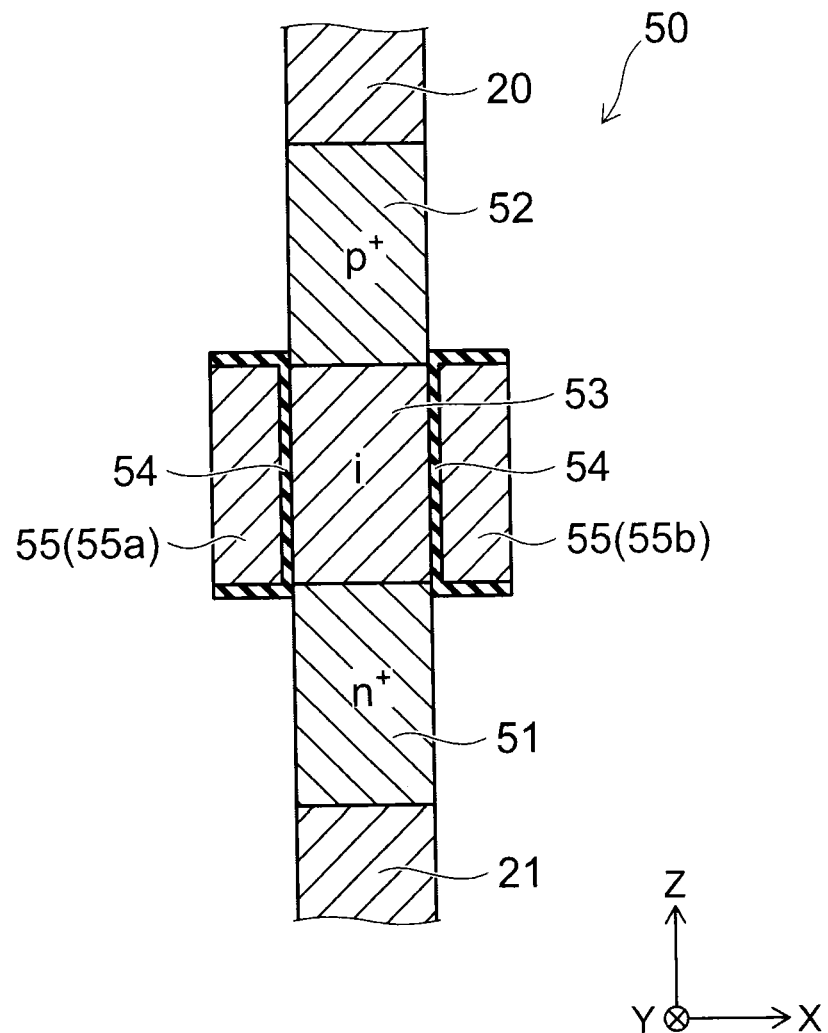
FIG. 5 is an example of a schematic cross sectional diagram illustrating the selectors 50 illustrated in FIG. 4.

FIG. 4 is an example of a diagram illustrating a relationship of the word lines and the selectors. FIG. 5 is an example of a schematic cross sectional diagram illustrating the selectors 50 illustrated in FIG. 4.

Each selector 50 includes an $n^+$ type (first conductivity type) of semiconductor layer 51 (first semiconductor layer), a $p^+$ type (second conductivity type) of semiconductor layer 52 (second semiconductor layer), and a semiconductor layer 53 (third semiconductor layer) provided between the semiconductor layer 51 and the semiconductor layer 52. Further, the selector 50 includes gate electrodes 55 contacting with the semiconductor layer 53 in the X direction via gate insulating films 54. The semiconductor layer 51, the semiconductor layer 53, and the semiconductor layer 52 are respectively aligned in the Z direction along which the local bit lines 20 extend.

That is, the selectors 50 of the first embodiment are transistors that transition to an on state and to an off state corresponding to a potential of the gate electrodes 55.

The gate electrodes 55 contain at least one of metal, semiconductor, or silicide, for example, titanium nitride, semiconductor to which impurities are doped, and the like. The gate insulating films 54 contain, for example, silicon oxide and the like.

As illustrated in FIG. 5, each selector 50 includes a first electrode region 55a and a second electrode region 55b. The semiconductor layer 53 is sandwiched in the X direction by the first electrode region 55a provided via the gate insulating film 54 and the second electrode region 55b provided via the gate insulating film 54. That is, the selector 50 has a so-called double gate structure having two gate electrodes 55a and 55b. Note that, the structure of the selectors 50 is not limited to the double gate structure. For example, the structure of the selectors 50 may be of a single gate structure having one of the first electrode region 55a and the second electrode region 55b.

Here, in the X direction, the gate insulating films 54 and the gate electrodes 55 make contact with side surfaces of the semiconductor layer 53. Note that, in the X direction, the gate insulating films 54 and the gate electrodes 55 may extend to the semiconductor layer 52 and the semiconductor layer 51.

The semiconductor layer 51, the semiconductor layer 52, and the semiconductor layer 53 respectively contain polysilicon (poly-Si). An impurity concentration of the semiconductor layer 53 is lower than an impurity concentration of the semiconductor layer 51 and an impurity concentration of the semiconductor layer 52. The semiconductor layer 51 contains impurity elements such as phosphorus (P), arsenic (As), and the like. The semiconductor layer 52 contains impurity elements, such as boron (B). The concentration of the impurities contained in the semiconductor layer 51 and the semiconductor layer 52 respectively is $1 \times 10^{20}$ (atoms/cm$^3$) or more. The semiconductor layer 53 is, for example, an intrinsic semiconductor layer. That is, the selector 50 has a pin structure (p$^+$ layer/i layer/n$^+$ layer). In the embodiment, the intrinsic semiconductor layer means not only semiconductors that completely do not contain any impurities, but also semiconductors containing impurities with lower concentration than the impurities contained respectively in the semiconductor layer 51 and the semiconductor layer 52.

Further, as illustrated in FIG. 4, every other word lines 30 are commonly connected, and configure the word lines WL_u and the word lines WL_s. On the other hand, the gate electrodes 55A to 55H can each operate independently. That is, the control circuit section 60 can control on and off of the selectors 50A to 50G by controlling the gate electrodes 55A to 55H. As a result, one or more of the plurality of local bit lines 20 connected to the global bit line 10 can be electrically connected to or disconnected from (selected for) the global bit line 10. Here, although every other word lines 30 are commonly connected, one memory layer 40 from among the plurality of memory layers 40 can be selected by the control circuit section 60 selecting one local bit line 20.

FIGS. 6A to 7B are examples of schematic stereographic diagrams illustrating a manufacturing process of the selectors of the first embodiment.

Figure 6A:
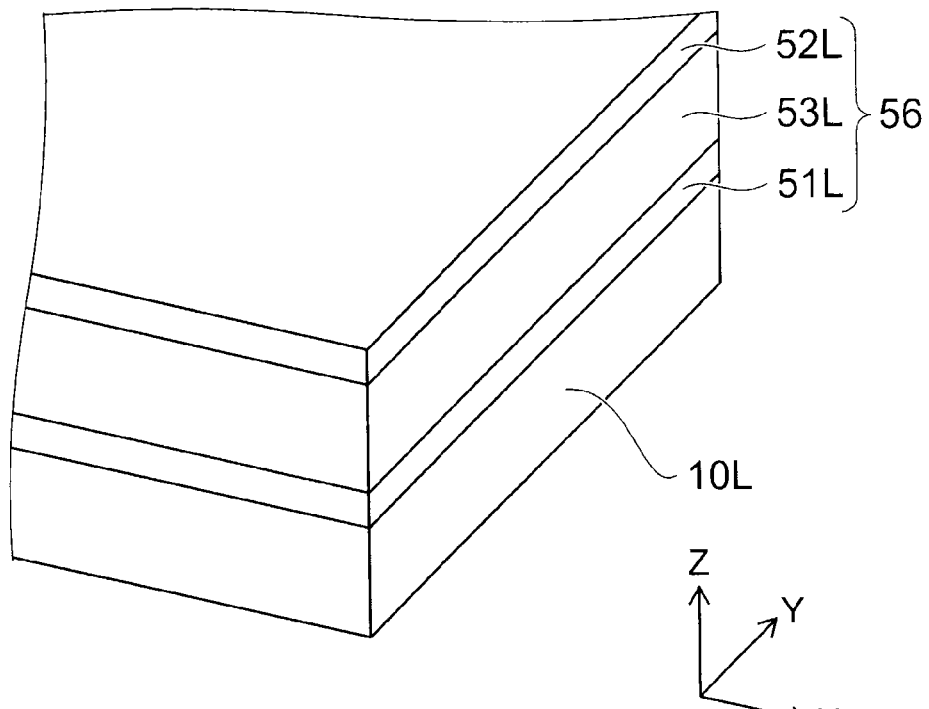
FIGS. 6A to 7B are examples of schematic stereographic diagrams illustrating a manufacturing process of the selectors of the first embodiment.

Firstly, as illustrated in FIG. 6A, a laminate body 56 in which a global bit line layer 10L, a semiconductor layer 51L, a semiconductor layer 53L, and a semiconductor layer 52L are laminated in this order is prepared. The laminate body 56 is formed on a lower layer (not illustrated), such as a silicon substrate and the like. A peripheral circuit including transistors and the like may be formed in advance on the lower layer on which the laminate body 56 is to be formed.

A layer thickness of the semiconductor layer 51L is 20 nm or less. A layer thickness of the semiconductor layer 53L is 60 nm or more and 200 nm or less. The layer thickness of the semiconductor layer 53L may be 200 nm or more. A layer thickness of the semiconductor layer 52L is 20 nm or less. Here, the semiconductor layer 51L may be deposited, for example, while causing impurity elements, such as phosphorous (P), arsenic (As) to be contained. Further, the semiconductor layer 53L may be deposited, for example, while causing impurity elements, such as boron (B) to be contained. As a result, the semiconductor layer 51L can be formed as an n type semiconductor layer, and the semiconductor layer 53L can be formed as a p type semiconductor layer.

Figure 6B:
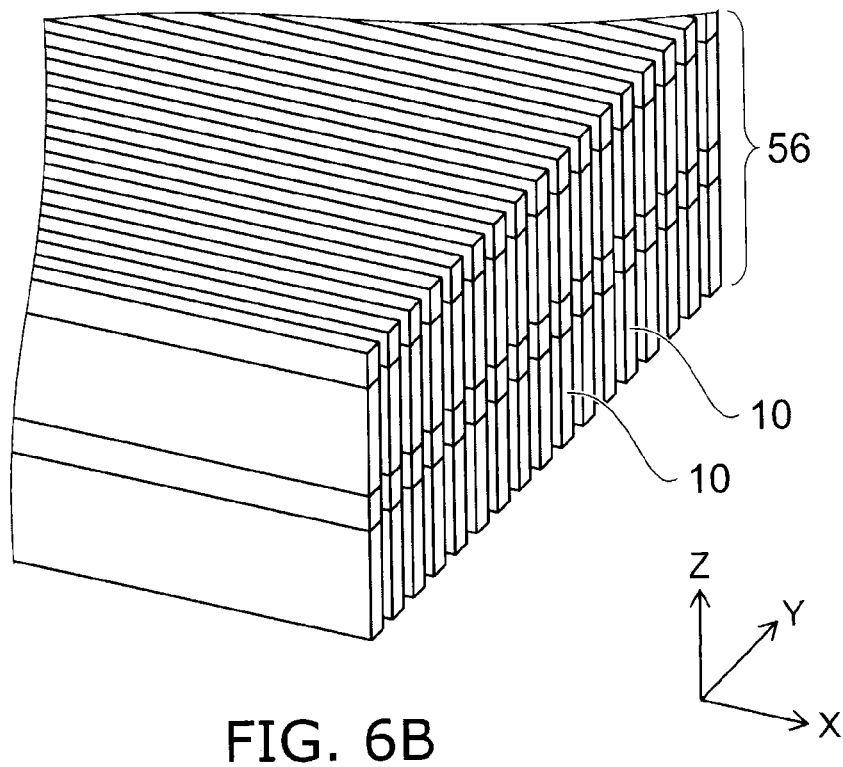

Next, as illustrated in FIG. 6B, the laminate body 56 is divided in the Y direction. In this division, a photolithography technique and a dry etching technique are utilized. Due to this, a structure in which each of the plurality of global bit lines 10 extends in the X direction is formed. Further, the semiconductor layer 51L, the semiconductor layer 53L, and the semiconductor layer 52L are formed on each of the plurality of global bit lines 10. Each of the semiconductor layers 51L, the semiconductor layers 53L, and the semiconductor layers 52L extends in the X direction.

Subsequently, the laminate body 56 on each of the plurality of global bit lines 10 is divided in the X direction. In this division, the photolithography technique and the dry etching technique are utilized. Such a state is illustrated in FIG. 7A.

Figure 7A:
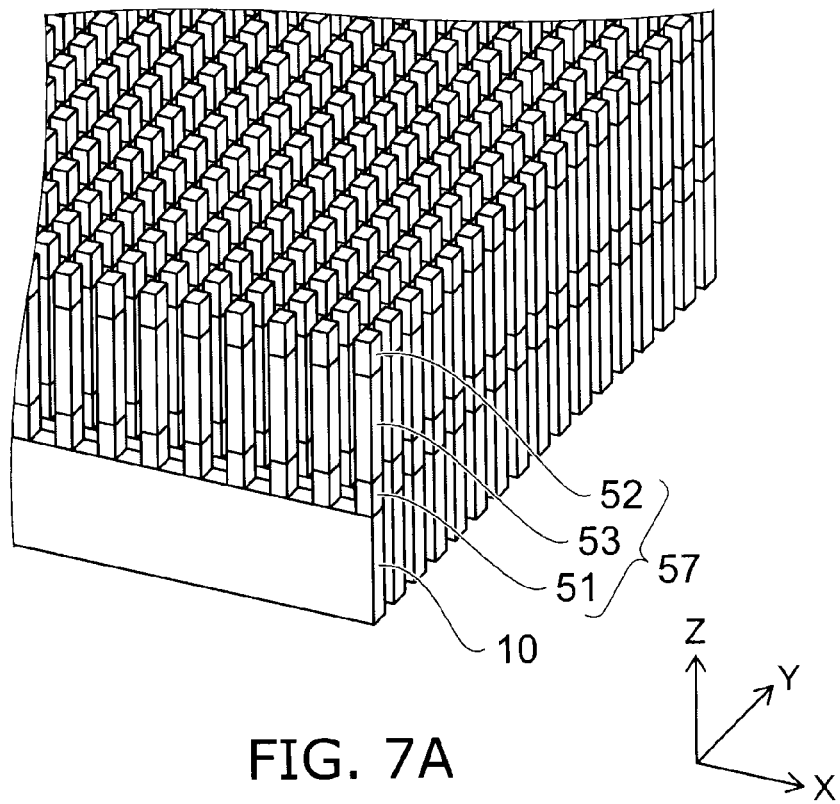

As illustrated in FIG. 7A, a plurality of laminate bodies 57, in each of which the semiconductor layer 51, the semiconductor layer 53, and the semiconductor layer 52 are laminated in this order is formed respectively on of the plurality of global bit lines 10. Each of the plurality of laminate bodies 57 extends in the Z direction. Each of the plurality of laminate bodies 57 has a pillar shape.

Figure 7B:
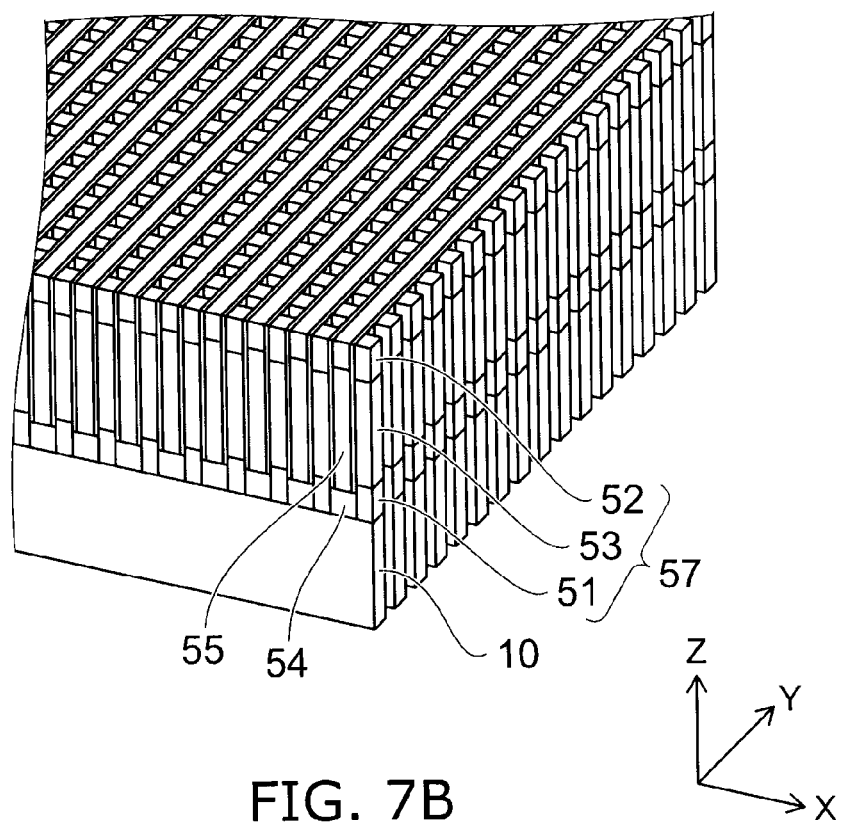

Next, as illustrated in FIG. 7B, the gate insulating films 54 and the gate electrodes 55 are formed between the respective ones of the plurality of laminate bodies 57 aligned in the X direction. By such a manufacturing process, the selectors 50 are formed.

Thereafter, the local bit lines 20, the word lines 30, and the memory layers 40 are formed on the laminate bodies 57.

An operation of the memory device 1 will be described. The operation of the memory device 1 is controlled by the control circuit section 60. For example, the set operation or the reset operation is performed on the memory layers 40 by the control of the control circuit section 60.

FIGS. 8A to 9C are examples of schematic diagrams illustrating the operation of the memory device of the first embodiment.

In FIGS. 8A to 8C, on and off states of the selectors 50 of the double gate structure are illustrated. An upper part of each of FIGS. 8A to 8C illustrates a schematic cross section of a selector 50. Further, potentials applied respectively to a global bit line 10, a local bit line 20, and gate electrodes 55 are illustrated. A middle part of each of FIGS. 8A to 8C illustrates an equivalent circuit diagram of the selector 50. A lower part of each of FIGS. 8A to 8C illustrates respective energy bands of the semiconductor layer 51, the semiconductor layer 53, and the semiconductor layer 52. Here, in order to describe an operation of the selector 50 in a simple manner, the description will be given in supposing that a voltage is applied to the local bit line 20.

A first potential (for example, 0V) is applied to the local bit line 20, and a second potential (for example, 2.0V) that is higher than the first potential is applied to the global bit line 10. As a result, a potential that is higher than a potential applied to the p$^+$ type semiconductor layer 52 is applied to the n$^+$ type semiconductor layer 51. In other words, a so-called reverse bias is applied to the semiconductor layers 51 to 53 of the selector 50. Further, a voltage that is higher than a threshold potential (Vth) at which the selector 50 comes to be in a conductive state will be termed a third potential (for example, 2.0V).

In FIG. 8A, a potential (for example, −1.0V) that is lower than the third potential is applied to each of the first electrode region 55a and the second electrode region 55b of the gate electrodes 55.

In this case, an electrostatic potential of the semiconductor layer 53 between the p$^+$ type semiconductor layer 52 and the n$^+$ type semiconductor layer 51 comes to be at substantially middle of an electrostatic potential of the p+ type semiconductor layer 52 and an electrostatic potential of the n+ type semiconductor layer 51. Accordingly, a potential barrier exists between the p+ type semiconductor layer 52 and the semiconductor layer 53, and between the n+ type semiconductor layer 51 and the semiconductor layer 53, respectively. That is, the selector 50 is in the off state, and a current does not flow between the global bit line 10 and the local bit line 20 through the selector 50.

In FIG. 8B, the potential (for example, −1.0V) that is lower than the third potential is applied to the first electrode region 55a of the gate electrode 55. On the other hand, the threshold potential (for example, 2.0V) is applied to the second electrode region 55b of the gate electrode 55.

In this case, the potential barrier between the n+ type semiconductor layer 51 and the semiconductor layer 53 somewhat decreases than in the state of FIG. 8A. However, a relatively high potential barrier exists between the p+ type semiconductor layer 52 and the semiconductor layer 53. As a result, the selector 50 is in the off state, and the current hardly flows between the global bit line 10 and the local bit line 20 through the selector 50.

On the other hand, in FIG. 8C, a potential (for example, 2.0V) that is not less than the third potential is applied to each of the first electrode region 55a and the second electrode region 55b of the gate electrodes 55.

In this case, the potential barriers of the semiconductor layer 53 are further decreased than in the state of FIG. 8B. On the other hand, a width of a depletion layer formed by a junction of the p+ type semiconductor layer 52 and the semiconductor layer 53 becomes narrow. As a result, an interband tunneling occurs between the p+ type semiconductor layer 52 and the semiconductor layer 53. That is, tunnel electrons flow from the p+ type semiconductor layer 52 to the semiconductor layer 53. As a result, the selector 50 is turned on. Here, the current flowing from the n+ type semiconductor layer 51 to the p+ type semiconductor layer 52 will be termed a current Ia.

Accordingly, the global bit line 10 and the local bit line 20 can be electrically communicated by applying the potential that is not less than the third potential on the gate electrodes 55 by applying the reverse bias on the selector 50.

Figure 9A:
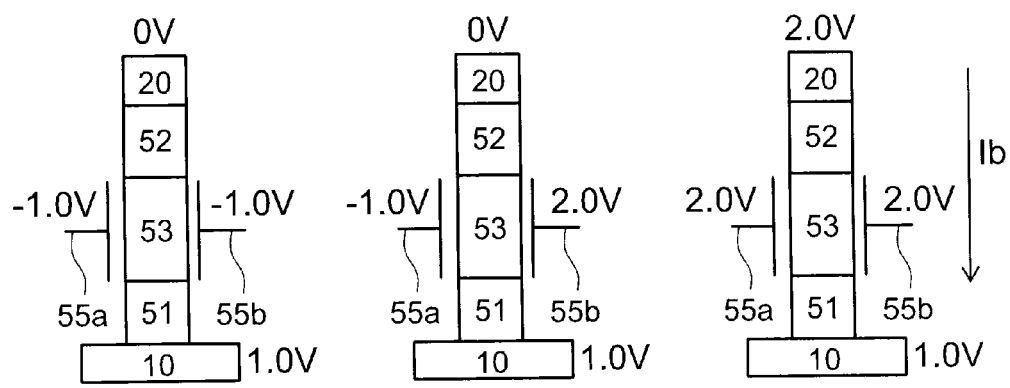
Figure 9A:
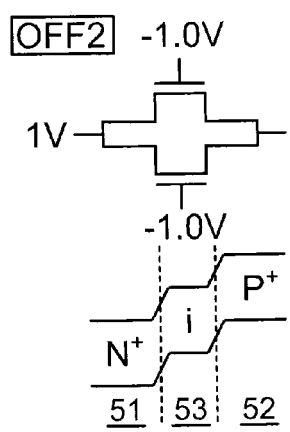
Figure 9B:
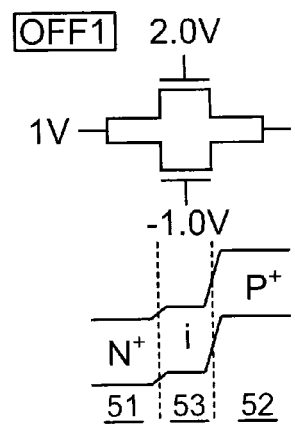
Figure 9C:
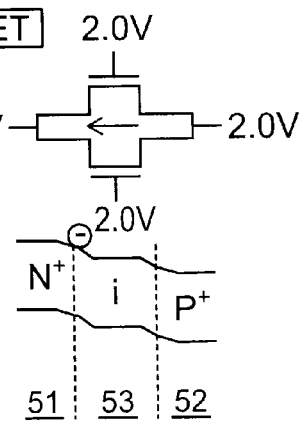

In FIGS. 9A to 9C, on and off states of the selectors 50 of the double gate structure are illustrated. An upper part of each of FIGS. 9A to 9C illustrates a schematic cross section of the selector 50. Further, potentials applied respectively to the global bit line 10, the local bit line 20, and the gate electrodes 55 are illustrated. A middle part of each of FIGS. 9A to 9C illustrates an equivalent circuit diagram of the selector 50. A lower part of each of FIGS. 9A to 9C illustrates respective energy bands of the semiconductor layer 51, the semiconductor layer 53, and the semiconductor layer 52.

Here, in FIGS. 9A and 9B, for example, 0V is applied to the local bit line 20, and 1.0V that is higher than 0V is applied to the global bit line 10. That is, a potential that is higher than a potential applied to the p+ type semiconductor layer 52 is applied to the n+ type semiconductor layer 51.

Further, in FIG. 9C, the third potential (for example, 2.0V) is applied to the local bit line 20, and a fourth potential (for example, 1.0V) that is lower than the third potential is applied to the global bit line 10. That is, a potential that is lower than the potential applied to the p+ type semiconductor layer 52 is applied to the n+ type semiconductor layer 51. In other words, in FIG. 9C, a so-called forward bias is applied to the selector 50.

In FIG. 9A, a potential (for example, −1.0V) that is lower than the third potential is applied respectively to the first electrode region 55a and the second electrode region 55b of the gate electrodes 55.

In this case, the electrostatic potential of the semiconductor layer 53 comes to be at substantially middle of the potential of the p+ type semiconductor layer 52 and the electrostatic potential of the n+ type semiconductor layer 51. Accordingly, the potential barrier exists between the p+ type semiconductor layer 52 and the semiconductor layer 53, and between the n+ type semiconductor layer 51 and the semiconductor layer 53, respectively. That is, the selector 50 comes to be in the off state.

In FIG. 9B, a potential (for example, −1.0V) that is lower than the third potential is applied to the first electrode region 55a of the gate electrode 55. On the other hand, the threshold potential (for example, 2.0V) is applied to the second electrode region 55b of the gate electrode 55.

In this case, the potential barrier between the n+ type semiconductor layer 51 and the semiconductor layer 53 somewhat decreases than in the state of FIG. 9A. However, a relatively high potential barrier exists between the p+ type semiconductor layer 52 and the semiconductor layer 53. As a result, the selector 50 comes to be in the off state.

On the other hand, in FIG. 9C, a potential (for example, 2.0V) that is not less than the third potential is applied to each of the first electrode region 55a and the second electrode region 55b of the gate electrodes 55. Further, a so-called forward bias is applied to the selector 50.

Accordingly, the electrostatic potential of the n+ type semiconductor layer 51 becomes higher than the electrostatic potential of the p+ type semiconductor layer 52. Further, the potential of the semiconductor layer 53 comes to be at substantially middle of the potential of the p+ type semiconductor layer 52 and the potential of the n+ type semiconductor layer 51. As a result, the selector 50 comes to be in the on state. Due to this, a current Ib flows from the p+ type semiconductor layer 52 to the n+ type semiconductor layer 51. The current flowing from the p+ type semiconductor layer 52 to the n+ type semiconductor layer 51 will be termed the current Ib. A direction of the current Ib is opposite to a direction of the current Ia.

The current Ia that flows by a tunneling effect has a larger current value than the current Ib that flows in the forward bias. Accordingly, respectively in write (set operation) and erase (reset operation) of the memory layers 40, in a case where magnitudes of the currents to be electrically turned on the memory layers 40 are difference, the selectors 50 of the first embodiment effectively function.

In the operation to cause the memory layers 40 to shift from a low resistance state to a high resistance state (reset operation), there are cases in which a larger current than for the operation to cause the memory layers 40 to shift from the high resistance state to the low resistance state (set operation) is required. Here, with the selectors 50 of the first embodiment, the selectors 50 function effectively in the reset operation and in the set operation since the current value to be electrically turned on the selectors 50 can be changed depending on polarities (forward bias or reverse bias) to be applied between the semiconductor layers 51 and the semiconductor layers 52.

Further, the selectors 50 have the pin structure. The pin structure is a three-layer structure of p+ layer/i layer/n+ layer. Accordingly, in a case where the reverse bias is applied to a selector 50 and the potential being smaller than the threshold potential is applied to the gate electrode 55, the potential barrier is formed between the p+ layer and the n+ layer. Due to this, an off-leak current can be made small.

Further, according to the selector structure of the first embodiment, the current can be flowed from a semiconductor layer 51 side to a semiconductor layer 52 side in the on state, or can be flowed from the semiconductor layer 52 side to the semiconductor layer 51 side. Accordingly, even if the order of lamination in which the semiconductor layer 51/the semiconductor layer 53/the semiconductor layer 52 are laminated in this order from the bottom (see FIG. 5) is changed to an order in which the semiconductor layer 52/the semiconductor layer 53/the semiconductor layer 51 are laminated in this order from the bottom, the same advantages can be achieved. In the embodiment, selectors that laminated the semiconductor layer 52/the semiconductor layer 53/the semiconductor layer 51 in this order from the bottom are also included.

Further, a direction of the semiconductor layer 52/the semiconductor layer 53/the semiconductor layer 51 contained in the selector 50 aligned is vertical with respect to a top surface of the lower layer. Accordingly, compared to a case in which the direction of the semiconductor layer 52/the semiconductor layer 53/the semiconductor layer 51 aligned becomes parallel to the top surface of the lower layer, an area of the selector 50 disposed is decreased, whereby a further refinement of the memory device can be realized.

Second Embodiment

Figure 10A:
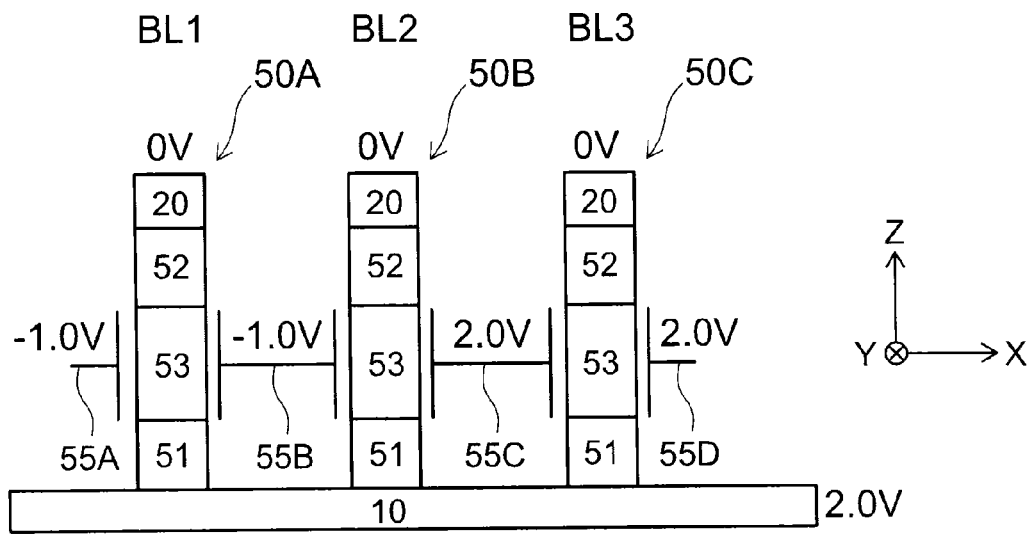
FIGS. 10A and 10B are examples of schematic cross sectional views illustrating selectors of a memory device of the second embodiment.
Figure 10B:
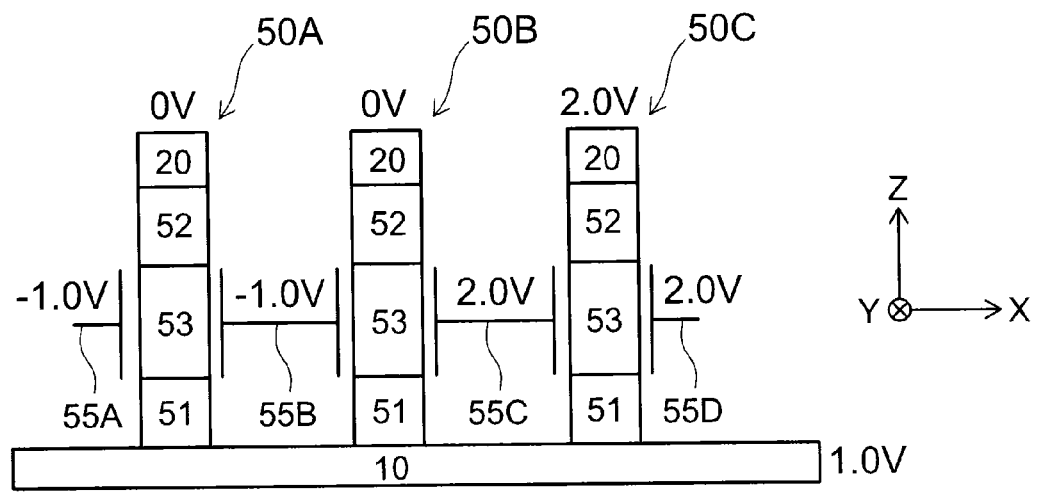

A second embodiment is an example that operates the selectors described in the first embodiment with the structure of FIG. 1B. FIGS. 10A and 10B are examples of schematic cross sectional views illustrating selectors of a memory device of the second embodiment.

In FIGS. 10A and 10B, three selectors 50A to 50C are illustrated as an example in a state of being aligned in an X direction. For example, in the X direction, the different selector 50B is juxtaposed to the selector 50A, and the different selector 50C is juxtaposed to the selector 50B. A configuration of the selectors 50A, 50B, 50C is identical.

The selector 50A and the selector 50B share a gate electrode 55B. The selector 50B and the selector 50C share a gate electrode 55C.

Note that, a plurality of the structures illustrated in FIGS. 10A and 10B is arranged in a Y direction in the drawings. Here, as for the selectors 50 that are juxtaposed in the Y direction, the gate electrodes 55 are commonly connected.

Firstly, the state of FIG. 10A will be described. FIG. 10A illustrates an example of a case in which a reset operation is performed by selecting a local bit line BL3.

A case will be considered in which a control circuit section 60 selects one memory cell from among memory layers 40 (memory cells) connected to a bit line 1C and performs a reset operation. The control circuit applies, for example, 0V as a reset voltage on a word line 30. However, as illustrated in FIG. 3, every other word lines 30 are commonly connected. That is, 0V is also applied to the word lines of the unselected memory cells connected to unselected local bit lines BL1, BL2. Thus, the control circuit controls the selectors 50 so that a current will not flow in the unselected local bit lines BL1, BL2.

The control circuit section 60 applies a potential of 2.0V to the global bit line 10. Note that, the control circuit applies, for example, 2.0V to the unselected word lines.

The control circuit section 60 applies a potential of −1.0V to each of the gate electrodes 55A, 55B. Here, the selector 50A is in the state of FIG. 8A, the selector 50B is in the state of FIG. 8B, and the selector 50C is in the state of FIG. 8C. Accordingly, the selector 50A and the selector 50B are in an off state (FIGS. 8A, 8B).

On the other hand, as in FIG. 8C, the selector 50C is in an on state.

Here, a case in which the unselected memory cells connected to the local bit lines BL1, BL2 are in a low resistance state, and 0V is applied to the word lines connected to these unselected memory cells will be considered. At such an occasion, 0V is transferred from the word lines to the local bit lines 1A, 1B via the unselected memory cells. However, the selector 50A and the selector 50B are in the off state (FIGS. 8A, 8B). As a result, the current does not flow in the unselected local bit lines BL1, BL2, and the unselected memory cells that are in the low resistance state do not shift to a high resistance state by the reset operation. On the other hand, 0V is transferred from the word line to the selected local bit line BL3 via the selected memory cell that is in the low resistance state. Here, the selector 50C is in the on state. As a result, the current flows in the selected memory cell that is in the low resistance state, and the selected memory cell in the low resistance state shifts to the high resistance state by the reset operation.

Subsequently, the state of FIG. 10B will be described. FIG. 10B illustrates an example of a case of performing a set operation by selecting the local bit line BL3.

The control circuit section 60 applies, for example, a potential of 1.0V to the global bit line 10.

The control circuit section 60 applies −1.0V potential to the gate electrodes 55A, 55B, and applies a potential of 2.0V to the gate electrode 55C. Here, the selector 50A is in the state of FIG. 9A, the selector 50B is in the state of FIG. 9B, and the selector 50C is in the state of FIG. 9C. Accordingly, the selectors 50A, 50B are in the off state as in FIG. 9A. On the other hand, the selector 50C is in the on state as in FIG. 9C.

Here, a case in which the unselected memory cells of the local bit lines BL1, BL2 are in the high resistance state, and 2.0V is applied to the word lines to which these unselected memory cells are connected will be considered. At such an occasion, the selector 50A and the selector 50B are in the off state (FIGS. 9A, 9B). As a result, the unselected local bit lines BL1, BL2 are in a floating state. Thereafter, even if a voltage of 2.0V is applied to the unselected local bit lines BL1, BL2 and the word lines, a current does not flow in the unselected memory cells. As a result, the unselected memory cells in the high resistance state do not shift to the low resistance state by the set operation.

On the other hand, a voltage is transferred to the selected local bit line 1C from the global bit line 10 via the selector 50. Here, a potential of about 1.0V to Vth is transferred to the global bit lines 10. As a result, a potential difference occurs between the selected memory cells of the low resistance state, and the unselected memory cell in the low resistance state shifts to the high resistance state by the reset operation.

Accordingly, even if one gate electrode 55 is shared by adjacent to selectors 50 among the plurality of selectors 50, a specific selector 50 can selectively be brought to the on state from among the plurality of selectors 50. Further, by sharing one gate electrode 55 by adjacent to the selectors 50, a distance between the juxtaposed selectors can be shortened. Due to this, the memory device can be processed in a finer manner.

Third Embodiment

Figure 11A:
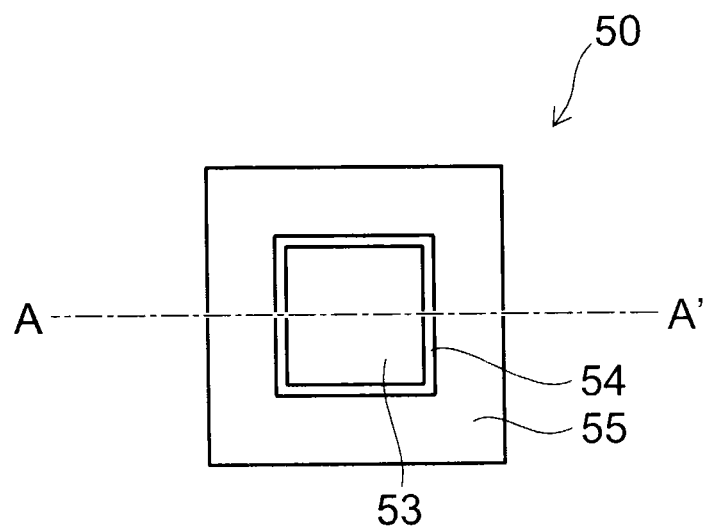
FIG. 11A is an example of a schematic plan diagram illustrating a selector of a memory device of a third embodiment.
Figure 11B:
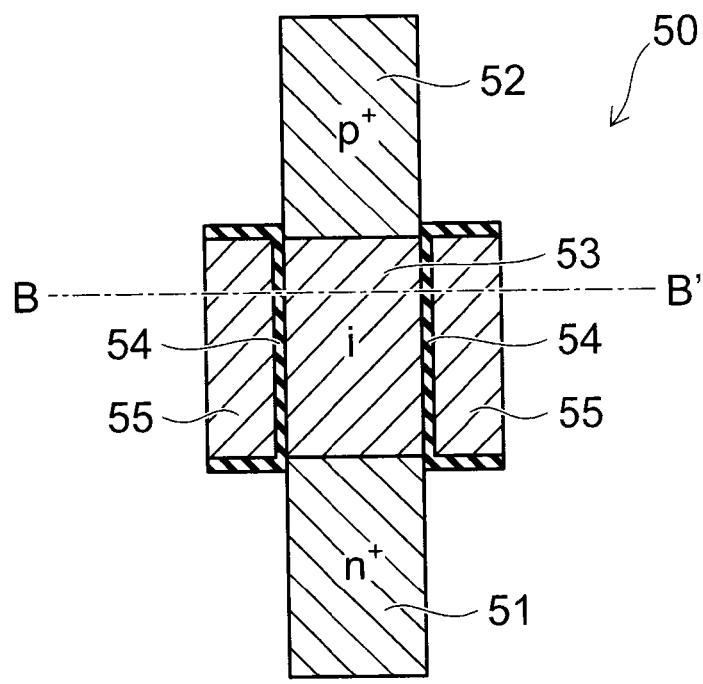
FIG. 11B is an example of a schematic cross sectional diagram illustrating the selector of the memory device of the third embodiment.

FIG. 11A is an example of a schematic plan diagram illustrating a selector of a memory device of a third embodiment, and FIG. 11B is an example of a schematic cross sectional diagram illustrating the selector of the memory device of the third embodiment.

FIG. 11A illustrates a B-B' cross section of FIG. 11B. FIG. 11B illustrates an A-A' cross section of FIG. 11A.

In the selector 50, a semiconductor layer 53 may be surrounded by a gate electrode 55 via a gate insulating film 54. According to such a structure, a channel density is increased, and current values of the currents Ia, Ib are made even larger. As a result, a driving force of the selector 50 is further increased.

Fourth Embodiment

Figure 12A:
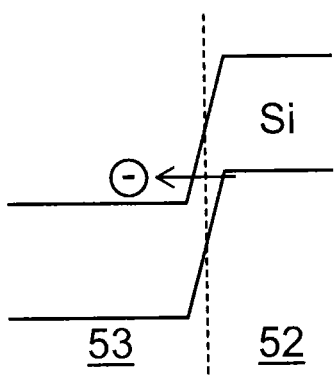
FIGS. 12A and 12B are examples of schematic diagrams illustrating an energy band of a selector of a memory device of a fourth embodiment.
Figure 12B:
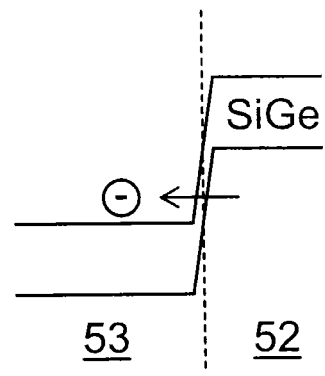

FIGS. 12A and 12B are examples of schematic diagrams illustrating an energy band of a selector of a memory device of a fourth embodiment. In FIGS. 12A and 12B, for example, 0V is applied to a word line 30 (local bit line 20), for example, and 2.0V is applied to a gate electrode, for example, and 2.0V is applied to a global bit line 10, for example. 2.0V is applied to each of a first electrode region 55*a* and a second electrode region 55*b* of a gate electrode 55, for example.

A material of a semiconductor layer 51, a semiconductor layer 52, and a semiconductor layer 53 may be polysilicon germanium (poly-SiGe) instead of polysilicon. A concentration of germanium (Ge) contained in the polysilicon germanium is 30% or less. Further, an impurity concentration of the semiconductor layer 53 is lower than an impurity concentration of the $n^+$ type semiconductor layer 51 and an impurity concentration of the $p^+$ type semiconductor layer 52.

For example, in FIG. 12A, the energy band in a case where each of the semiconductor layer 51, the semiconductor layer 52, and the semiconductor layer 53 contains polysilicon is illustrated. In this case, as described above, tunneling electrons flow from the semiconductor layer 52 to the semiconductor layer 53 (see FIG. 8C).

In FIG. 12B, the energy band in a case where each of the semiconductor layer 51, the semiconductor layer 52, and the semiconductor layer 53 contains polysilicon germanium is illustrated. In this case, a width of a depletion layer between the semiconductor layer 52 and the semiconductor layer 53 is further narrowed than in the state illustrated in FIG. 12A, and even a larger amount of tunneling electrons flow from the semiconductor layer 52 to the semiconductor layer 53. That is, the current value of the current Ia becomes even larger. As a result, a driving force of the selector 50 is further increased.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

The term "on" in "a portion A is provided on a portion B" refers to the case where the portion A is provided on the portion B such that the portion A is in contact with the portion B and the case where the portion A is provided above the portion B such that the portion A is not in contact with the portion B.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising:
   a first interconnect extending in a first direction;
   a plurality of second interconnects extending in a second direction intersecting with the first direction, and having lower ends positioned on the first interconnect;
   a plurality of third interconnects extending in a third direction intersecting with the second direction;
   a memory layer provided between the second interconnects and the third interconnects; and
   selectors respectively provided between the first interconnect and the lower ends of the plurality of second interconnects,
   the selectors including:
      a first semiconductor layer of a first conductivity type;
      a second semiconductor layer of a second conductivity type, the second conductivity type being a conductivity type different from the first conductivity type;
      a third semiconductor layer provided between the first semiconductor layer and the second semiconductor layer, and the third semiconductor layer having an impurity concentration lower than an impurity concentration of the first semiconductor layer and an impurity concentration of the second semiconductor layer; and
      an electrode contacting with the third semiconductor layer via an insulating film,
   the first semiconductor layer, the second semiconductor layer, and the third semiconductor layer respectively including polysilicon or polysilicon germanium, and
   the first semiconductor layer, the third semiconductor layer, and the second semiconductor layer respectively being aligned in the second direction.

2. The device according to claim 1, wherein
   the electrode includes a first electrode region and a second electrode region, and
   the third semiconductor layer is sandwiched by the first electrode region and the second electrode region via the insulating film.

3. The device according to claim 1, wherein
   the third semiconductor layer is surrounded by the electrode via the insulating film.

4. The device according to claim 1, wherein
   the concentrations of impurities contained respectively in the first semiconductor layer and the second semiconductor layer are $1 \times 10^{20}$ (atoms/cm$^3$) or more.

5. The device according to claim 1, further comprising:
   a control circuit,
   wherein the control circuit is configured to apply voltages respectively to the first interconnect, the third interconnects, and the electrodes, and
   the control circuit is configured to perform a first operation of applying a first potential to the third interconnects, and a second potential higher than the first potential to the first interconnect, and further applying a potential higher than a third potential to the electrodes.

6. The device according to claim 5, wherein
a resistance of the memory layer after the first operation is high compared to a resistance of the memory layer before the first interconnect and the second interconnects are electrically conducted.

7. The device according to claim 1, further comprising:
a control circuit,
wherein the control circuit is configured to apply voltages respectively to the first interconnect, the third interconnects, and the electrodes, and
the control circuit is configured to perform a second operation of applying a fourth potential to the third interconnects, and a fifth potential lower than the fourth potential to the first interconnect, and further applying a potential not less than a sixth potential to the electrodes.

8. The device according to claim 7, wherein
a resistance of the memory layer after the second operation is low compared to a resistance of the memory layer before the first interconnect and the second interconnects are electrically conducted.

9. The device according to claim 1, further comprising:
a control circuit,
wherein the control circuit is configured to apply voltages respectively to the first interconnect, the second interconnects, and the electrodes, and
a first current value is current flowing between the first interconnect and the second interconnects by applying a first potential to the third interconnects, and a second potential higher than the first potential to the first interconnect, and further applying a potential higher than a third potential to the electrodes, and a second current value is current flowing between the first interconnect and the second interconnects by applying a fourth potential to the third interconnects and a fifth potential lower than the fourth potential to the first interconnect, and further applying a potential not less than a sixth potential to the electrodes, and the first current value is larger than the second current value.

10. The device according to claim 1, further comprising:
another first interconnect extending in the first direction;
another second interconnect extending in the second direction, and having a lower end positioned on the other first interconnect;
another memory layer provided between the other second interconnect and the plurality of third interconnects; and
another selector provided between the other first interconnect and the lower end of the other second interconnect,
wherein a configuration of the other selector is identical to a configuration of the selectors,
the other selector is disposed adjacent to the selectors, and
the other selector and one of the selectors share the same electrode.

11. The device according to claim 1, wherein
the first conductivity type is an n type,
the second conductivity type is a p type,
the first semiconductor layers are in contact with the first interconnect, and
the second semiconductor layers are in contact with the second interconnects.

12. The device according to claim 1, wherein
every n lines of third interconnects (n being an integer of 1 or more) are commonly connected.

13. A memory device comprising:
a first interconnect extending in a first direction;
a plurality of second interconnects extending in a second direction intersecting with the first direction, and having lower ends positioned on the first interconnect;
a plurality of third interconnects extending in a third direction intersecting with the second direction;
a memory layer provided between the second interconnects and the third interconnects;
selectors respectively provided between the first interconnect and the lower ends of the plurality of second interconnects, and the selectors having second semiconductor layers respectively aligned in the second direction; and
a control circuit,
the selectors including:
a first semiconductor layer of a first conductivity type;
a second semiconductor layer of a second conductivity type;
a third semiconductor layer provided between the first semiconductor layer and the second semiconductor layer, and the third semiconductor layer having an impurity concentration lower than an impurity concentration of the first semiconductor layer and an impurity concentration of the second semiconductor layer; and
a electrode contacting with the third semiconductor layer via an insulating film,
the third interconnects including a first set of third interconnects commonly connected and a second set of third interconnects commonly connected, and
the control circuit being configured to apply a potential to the first interconnect, selecting one of the selectors, and selecting the first set of third interconnects.

14. The device according to claim 13, wherein
the control circuit applies a positive voltage to the electrode of the selected selector to turns on, and to turn off one of unselected selectors other than the selected selector.

15. The device according to claim 14, wherein
the electrode includes a first electrode region and a second electrode region, and
the third semiconductor layer is sandwiched by the first electrode region and the second electrode region via the insulating film.

16. The device according to claim 15, wherein
the control circuit is configured to apply a positive first voltage to the first electrode region and the second electrode region of the selected selector, and
the first voltage is applied to the first electrode region of the electrode of the unselected selector to be turned off, and a second voltage that is smaller than the first voltage is applied to the second electrode region.

* * * * *